(12) United States Patent
Wu et al.

(10) Patent No.: US 11,302,386 B2
(45) Date of Patent: *Apr. 12, 2022

(54) DISTRIBUTED BIAS GENERATION FOR AN INPUT BUFFER

(71) Applicant: Micron Technology, Inc., Boise, ID (US)

(72) Inventors: Xinyu Wu, Boise, ID (US); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/133,755

(22) Filed: Dec. 24, 2020

(65) Prior Publication Data

US 2021/0158858 A1  May 27, 2021

Related U.S. Application Data

(63) Continuation of application No. 16/696,225, filed on Nov. 26, 2019, now Pat. No. 10,892,005.

(51) Int. Cl.
 *G11C 11/4093* (2006.01)
 *G11C 11/4074* (2006.01)

(52) U.S. Cl.
 CPC ...... *G11C 11/4093* (2013.01); *G11C 11/4074* (2013.01)

(58) Field of Classification Search
 None
 See application file for complete search history.

(56) References Cited

U.S. PATENT DOCUMENTS

| 9,711,189 B1* | 7/2017 | Wang ............... G11C 29/028 |
| 2015/0023112 A1* | 1/2015 | Eom ............... G11C 11/4076 |
| | | 365/189.05 |
| 2015/0194195 A1 | 7/2015 | Yu et al. |

FOREIGN PATENT DOCUMENTS

| CN | 107431490 A | 12/2017 |
| CN | 109416916 A | 3/2019 |
| CN | 110277112 A | 9/2019 |

OTHER PUBLICATIONS

Chinese office Action for CN App. No. 202010732478.9, dated Feb. 24, 2022, 7 pages.

* cited by examiner

*Primary Examiner* — James G Norman
(74) *Attorney, Agent, or Firm* — Fletcher Yoder, P.C.

(57) ABSTRACT

Devices and methods include distributing biases for input buffers of a memory device. The devices include multiple input buffers configured to buffer data for storage in the multiple memory banks. The devices also include biasing generation and distribution circuitry configured to generate and distribute biases to the multiple input buffers. The biasing generation and distribution circuitry includes bias voltage generation circuitry and multiple remote resistor stacks each located at a corresponding input buffer of the input buffers and remote from the bias voltage generation circuitry.

19 Claims, 6 Drawing Sheets

DISTRIBUTED BIAS GENERATION FOR AN INPUT BUFFER

CROSS-REFERENCE TO RELATED APPLICATIONS

This application is a continuation of U.S. patent application Ser. No. 16/696,225, now patented as U.S. Pat. No. 10,892,005, entitled "DISTRIBUTED BIAS GENERATION FOR AN INPUT BUFFER", filed on Nov. 26, 2019, which is incorporated by reference herein in its entirety for all purposes.

BACKGROUND

Field of the Present Disclosure

Embodiments of the present disclosure relate generally to the field of semiconductor devices. More specifically, embodiments of the present disclosure relate to using bias generation and distribution for an input buffer of a memory device.

Description of Related Art

Semiconductor devices (e.g., memory devices) may utilize input buffers. For instance, dynamic random-access memory (DRAM) devices may use input buffers that use biasing to control how the input buffer and/or the input buffer channel behaves and to aid in memory operations for the DRAM devices. For example, a bias current and/or voltage may be used to bias circuitry (e.g., transistors) in the input buffer and/or input buffer channel. However, a response speed for centralized biasing circuitry in changing biasing voltages/currents in training may be lower than is suitable for higher-speed DRAM devices. For instance, the response speeds for the biasing voltage/currents may be outside of a Joint Electron Device Engineering Council (JEDEC) double-data type 5 (DDR5) specification.

Embodiments of the present disclosure may be directed to one or more of the problems set forth above.

DETAILED DESCRIPTION

Figure 1:
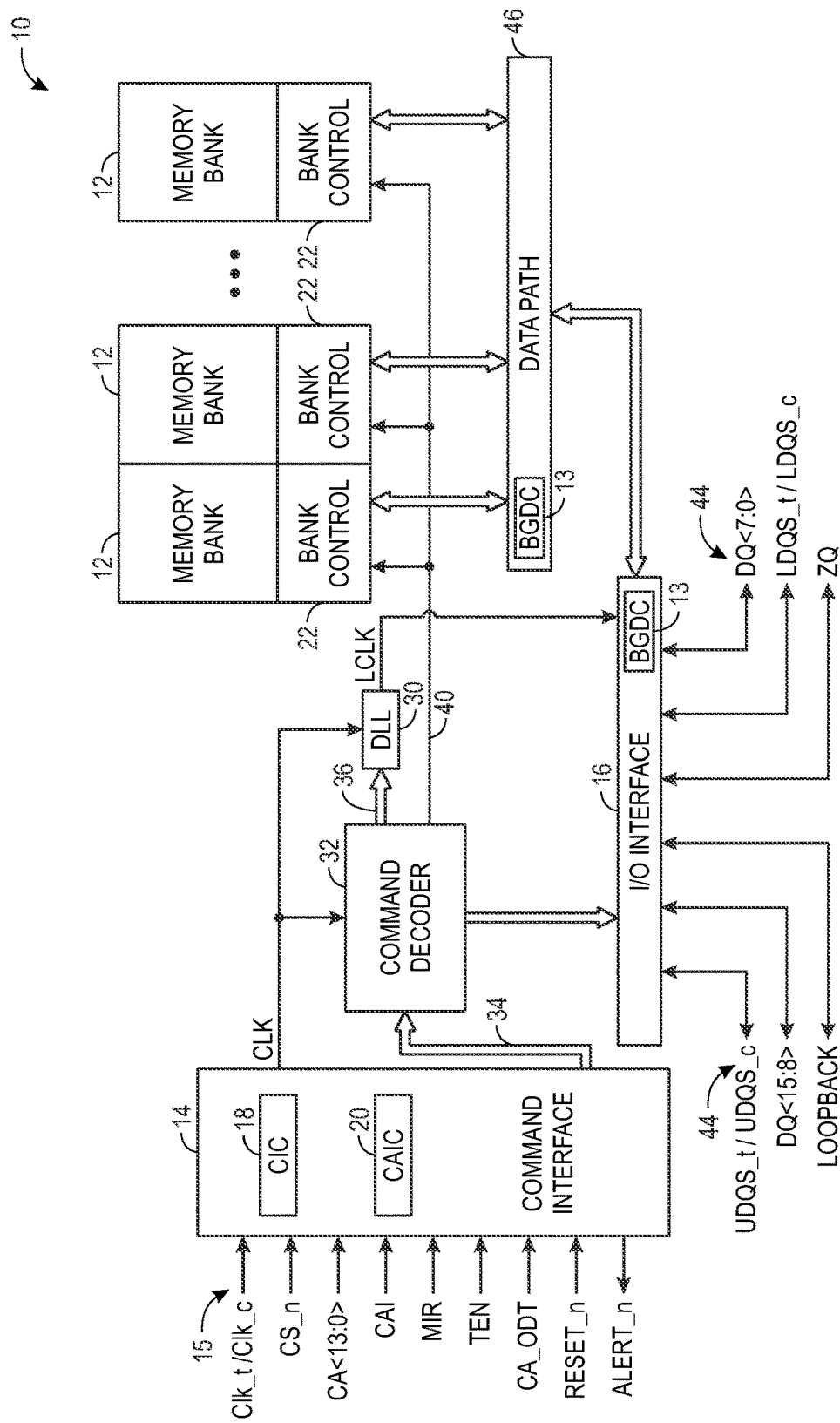
FIG. 1 is a simplified block diagram illustrating certain features of a memory device having bias generation and distribution circuitry, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks using input buffers. These input buffers and/or their corresponding channels are biased to cause the input buffers and/or their corresponding channels to behave in a consistent and intended manner. The biasing circuitry may include input buffer biasing generation and distribution circuitry that provides groups of voltage signals to the input buffers. Each group of voltage signals includes a number (e.g., tens) of individual signals with different voltage levels. For example, a three-stage structure may be used to generate these voltage levels. The first stage generates a number (e.g., three pairs) of primary voltages of which the voltage level may be selected by mode registers. The primary voltages may be buffered by stable voltage amplifiers, and each pair is converted into some number (e.g., tens, hundreds) of secondary voltages in a resistor stack. In traditional biasing circuitry, multiple stages are designed and placed in a block away from (e.g., up to 800 µm from) input buffers. However, the response time of the biasing circuitry may be inhibited by this distance, and the entire biasing circuitry may not be moved close to the input buffers due to other circuitry around the input buffers.

Instead, to improve response time, remote resistor stacks may be placed close (e.g., within 100 µm) to the input buffers. This new architecture of the input buffer biasing generation circuitry may include a bias base block that is built up with first and second stages of the traditional design. However, a distribution network may utilize multiple remote resistor stacks near the input buffers. Specifically, the remote resistor stacks are separated from the bias base block and are split into multiple resistor stacks and placed close to input buffers. Multiple input buffers (e.g., one, two, or four input buffers) may share a single remote resistor stack. The remote resistor stacks are connected to the bias base block via the distribution network using metal widths that are specifically selected to reduce the resistance to offset resistance increases due to the length between the presence of the remote resistor stacks near the input buffers while the bias base block is located away from the input buffers. The distributed nature of the remote resistor stacks near the input buffers provides an improved response time while consuming less power per input buffer. Additionally, the area of the biasing circuitry is similar in size to the traditional design while achieving such benefits.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (MUMS). Each MUM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include biasing generation and distribution circuitry 13 that generates and distributes biasing current and/or current for use in biasing input buffers for the memory device 10. The biasing generation and distribution circuitry 13 may be included in the I/O interface 16 and/or the datapath 46.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/ crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signals/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the 10 interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
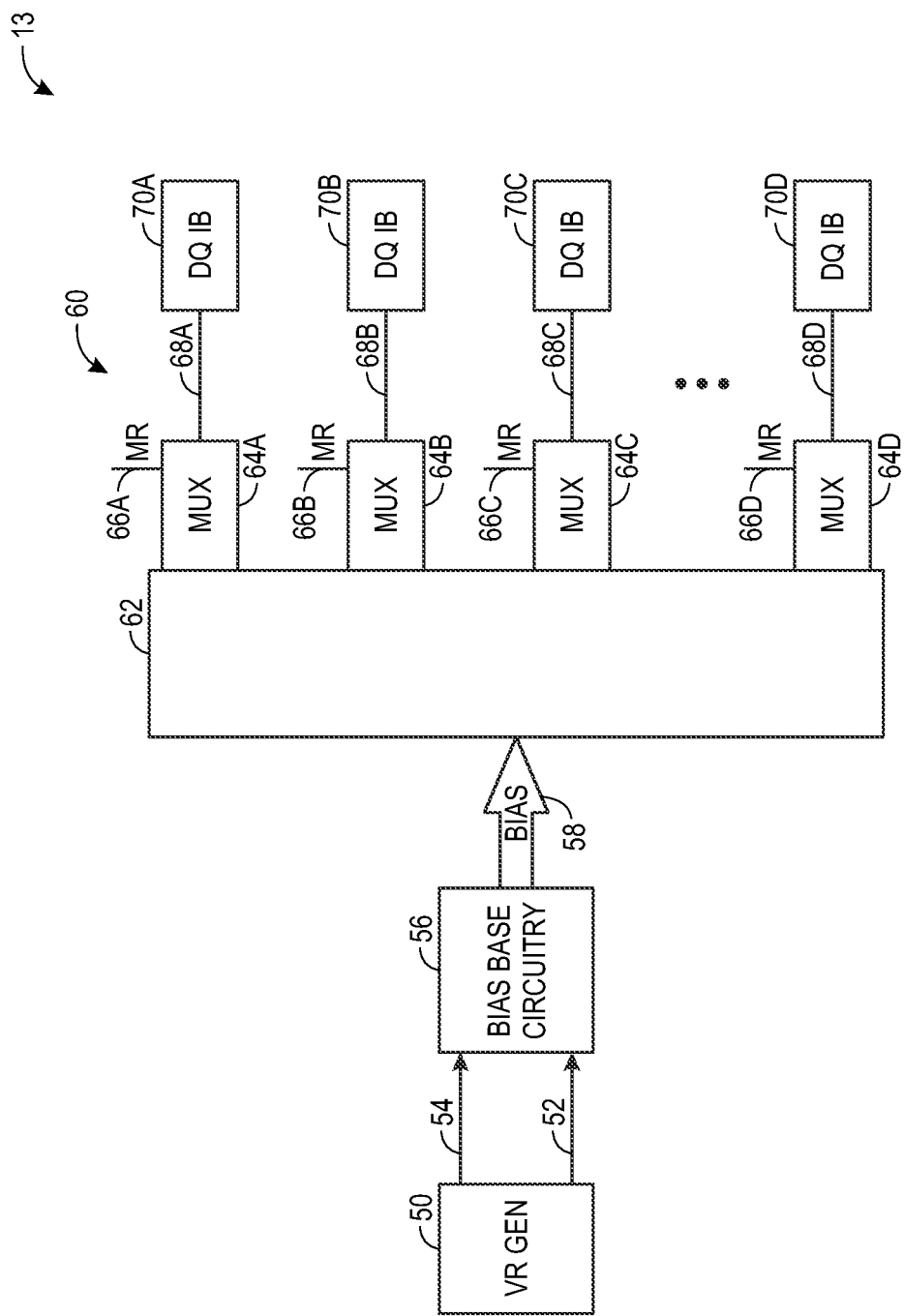
FIG. 2 is a block diagram of bias generation and distribution circuitry of FIG. 1, according to an embodiment of the present disclosure.

Turning now to FIG. 2, FIG. 2 illustrates an embodiment of the bias generation and distribution circuitry 13. As illustrated, the bias generation and distribution circuitry 13 includes voltage reference generator circuitry 50 that generates a reference voltage 54. The voltage reference generator circuitry 50 may also generate a minimum reference voltage 52 that may be a baseline for the reference voltage 54. The reference voltage 54 (and the minimum reference voltage 52) is used to bias base circuitry 56 that provides one or more biases 58 to bias distribution circuitry 60 based at least in part on a voltage differential between the reference voltage 54 and the minimum reference voltage 52. The biases 58 may include bias voltages and/or bias currents. The bias distribution circuitry 60 includes a resistor stack 62 that is used to provide multiple biases to each multiplexer 64 (referred to individually as multiplexers 64A, 64B, 64C, and 64D). Each multiplexer 64 receives one or more mode register values 66 (referred to individually as mode register values 66A, 66B, 66C, and 66D) that may be received by the memory device 10 (e.g., from a host device/processor). Each multiplexer 64 then selects a selected bias 68 (referred to individually as biases 68A, 68B, 68C, and 68D) from the respective potential biases from the resistor stack 62 to the respective multiplexers 64. Each selected bias 68 is then transmitted to a respective input buffer 70 (referred to individually as input buffers 70A, 70B, 70C, and 70D). The selected bias 68 causes the input buffer 70 to function as intended. For example, the selected bias 68 may be used to bias circuitry (e.g., a transistor) in the input buffer 70 and/or an input buffer channel during a write command used to write data to the memory banks 12. Thus, in summary, the bias base circuitry 56 generates one or more (e.g., six) biases 58 that are submitted to the bias distribution circuitry 60 with at least a portion of the biases from the resistor stacks 62 transmitted to the multiplexer 64A that selects the selected bias 68A for the input buffer 70A from the at least the portion of the biases based on the mode register value 66A.

Figure 3:
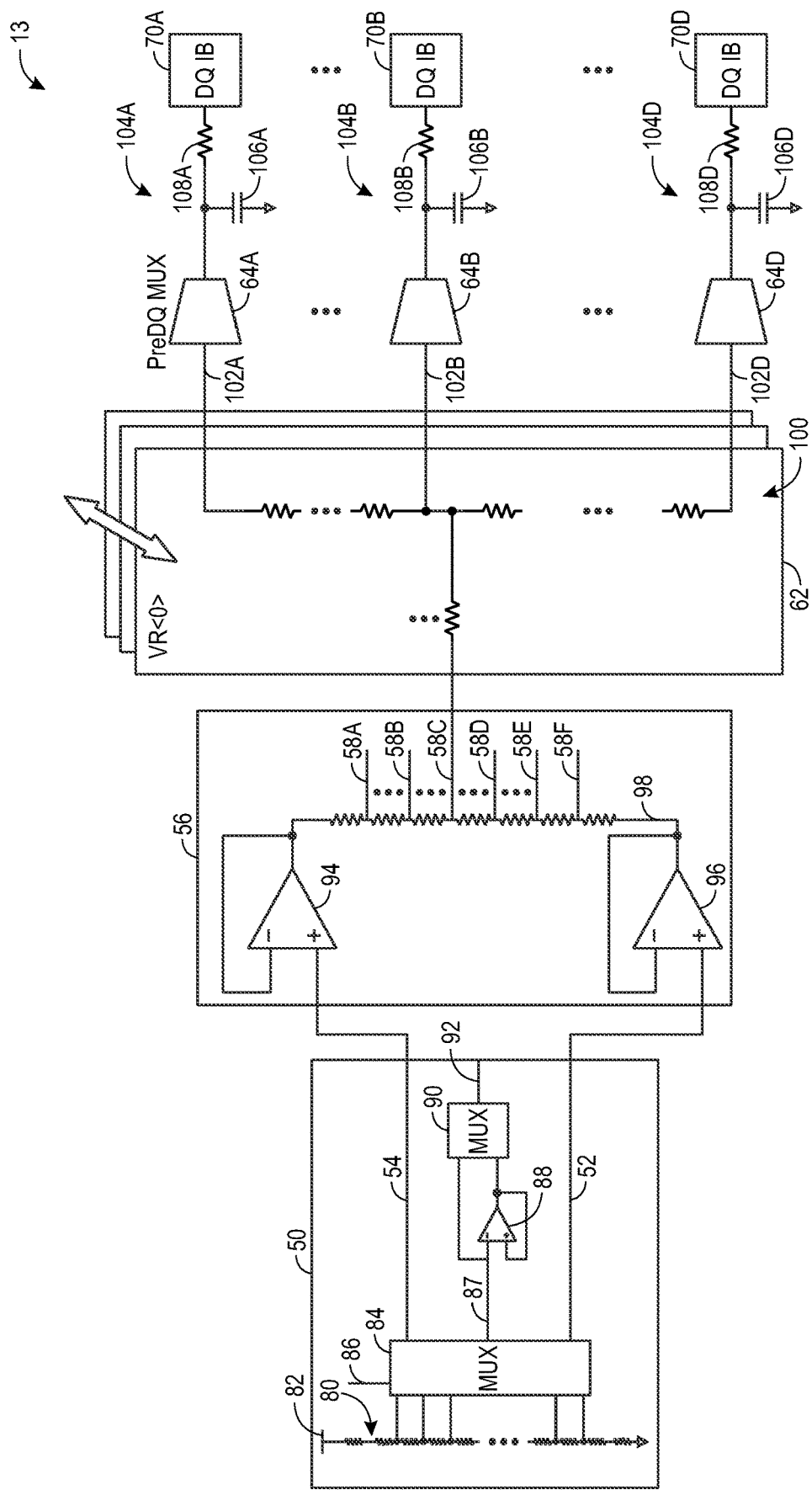
FIG. 3 is a circuit diagram of the bias generation and distribution circuitry of FIG. 2, according to an embodiment of the present disclosure.

FIG. 3 is a circuit diagram of an embodiment of the bias generation and distribution circuitry 13 of FIG. 2, As illustrated, an embodiment of the voltage reference generator circuitry 50 may include a resistor stack 80 that uses a voltage 82 to output multiple voltages to a multiplexer 84 that uses a mode register value(s) 86 to select the reference voltage 54 (here the maximum reference voltage) and the minimum reference voltage 52. The multiplexer 84 may also be used to select an intermediate reference voltage 87. The intermediate reference voltage 87 is transmitted to a non-inverting amplifier 88 that is used to boost the intermediate reference voltage 87. A multiplexer 90 may be used to select between the amplified and non-amplified versions of the intermediate reference voltage 87 to be output from the voltage reference generator circuit 50 as an additional reference voltage 92. In some embodiments, this additional reference voltage 92 may be used as additional inputs to one or more resistor stacks to control a shape of voltage intervals in the one or more resistor stacks.

The bias base circuitry 56 receives the reference voltage 54 and the minimum reference voltage 52 that are both received at respective non-inverting amplifiers 94 and 96 that apply a voltage difference between the reference voltage 54 and the minimum reference voltage 52 across a resistor stack(s) 62 that is used to generate the different biases 58 at different levels. For instance, the biases 58 may include biases 58A, 58B, 58C, 58D, 58E, and 58F in decreasing increments based on the resistance values of the resistors of the resistor stack(s) 62 and/or application of any intermediate voltage levels (e.g., the additional reference voltage 92). For instance, in some embodiments, the resistors of the resistor stack(s) 62 may have the same resistance causing the biases 58 to be distributed equally between the reference voltage 54 and the minimum reference voltage 52. Alternatively, the resistors of the resistor stack(s) 62 may have different resistance values to cause the incremental voltage levels between the biases 58 to be different between different resistors. In other words, for example, in some embodiments, the voltage difference between biases 58A and 58B may be different than a voltage difference between biases 58B and 58C.

The resistor stack(s) 62 may include one bias resistor stack 100 for each of the biases 58 that produce biases 102 from respective biases 58. For example, the bias 58C may be transmitted into a respective bias resistor stack 100 and used to output biases 102A, 102B, and 102D (among other biases). The biases 102 are transmitted to respective multiplexers 64 and ultimately to respective input buffers 70. The biases 102 may be filtered in filters 104 (individually referred to as filters 104A, 104B, and 104D, among other filters). Each filter 104 may be an RC filter that includes a capacitor 106 and resistor 108. For example, a filter 104A may include a capacitor 106A and a resistor 108A; a filter 104B may include a capacitor 106B and a resistor 108B; and a filter 104D may include a capacitor 106D and a resistor 108D.

Using the bias generation and distribution circuit 13 of FIGS. 2 and 3, a response to set the biases 102 may be insufficient to meet requirements (e.g., JEDEC DDR5 specified requirements). Instead, remote resistor stacks (RRS) may be located close to (e.g., within 100 μm) the input buffers with the bias distribution circuitry 60 configured to accommodate the RRS, which may reduce the response time of the bias generation and distribution circuitry 13 without compromising power efficiency.

Figure 4:
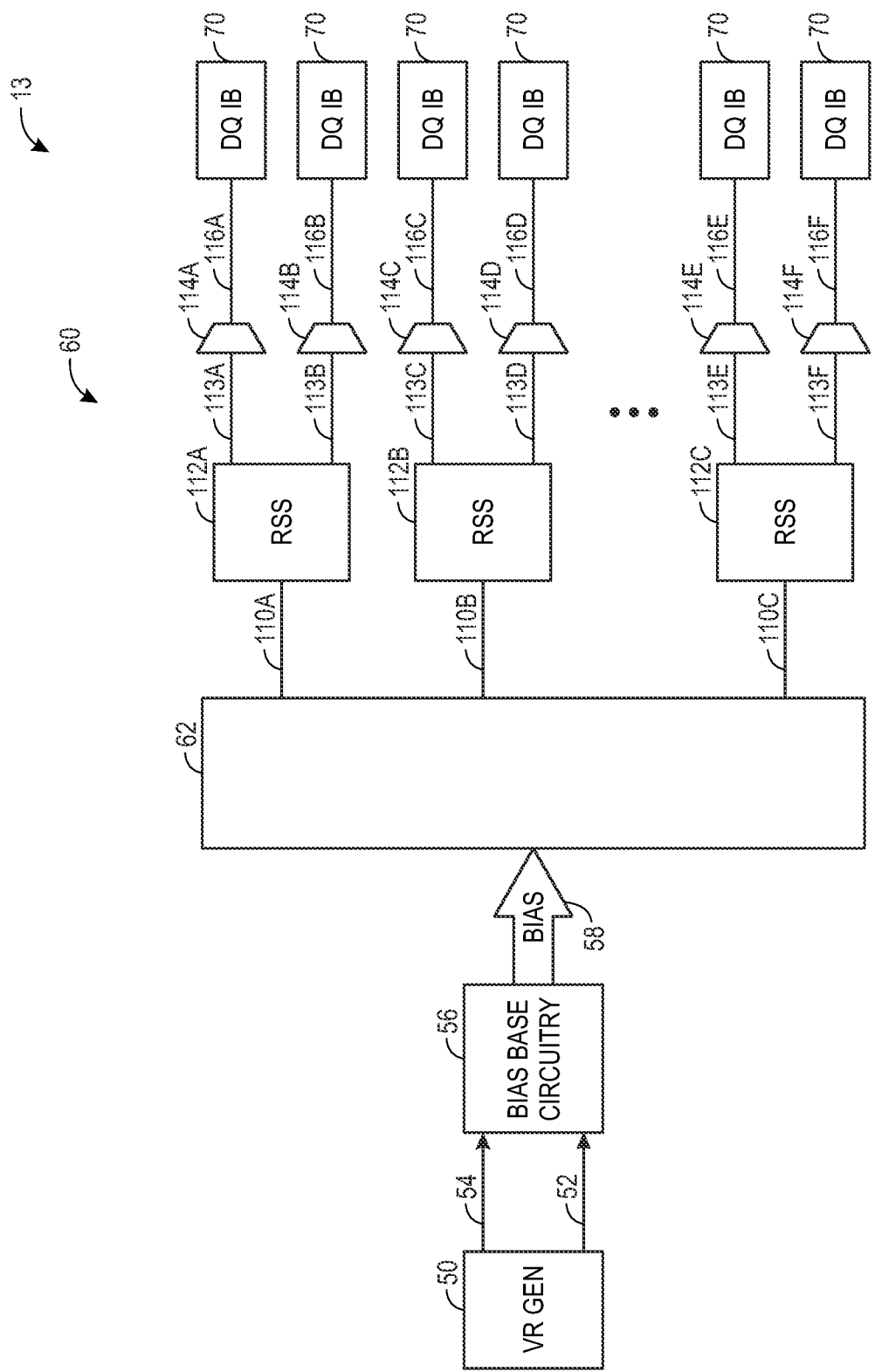
FIG. 4 is a block diagram of bias generation and distribution circuitry of FIG. 1 having a distributed architecture with remote resistor stacks, according to an embodiment of the present disclosure.

For example, FIG. 4 illustrates an embodiment of the bias generation and distribution circuitry 13 where the bias generation and distribution circuitry 13 includes RRS 112 (individually referred to as RRSs 112A, 112B, and 112C) that enable a faster response for the bias generation and distribution circuitry 13. As illustrated, the bias generation and distribution circuitry 13 includes the voltage reference generator circuitry 50 to generate the reference voltage 54 and the minimum reference voltage 52 that are transmitted to the bias base circuitry 56. However, the bias distribution circuitry 60 includes the RRS 112 distributed throughout the memory device 10 at a location close the respective input buffers. Since, in the bias generation and distribution circuitry 13, the RRSs 112 may be distributed while the resistor stack 62 is centralized, routes 110 (individually referred to as routes 110A, 110B, and 110C) from the resistor stack 62 may be longer than connections between the resistor stack 62 and the multiplexers 64 in the bias generation and distribution circuitry 13 of FIGS. 2 and 3. To accommodate for this additional length, the routes 110 and/or other portions of the bias distribution circuitry 60 may use metals of specific types and/or sizes to reduce the resistance occurring due to the lengthening of the routes 110.

Each RRS 112 receives one or more bias voltages via a route 110 and outputs local biases 113 (individually illustrated as local biases 113A, 113B, 113C, 113D, 113E, and 113F). Each RRS 112 may output one or more local biases 113 as potential biases to a respective multiplexer 114 (individually illustrated as multiplexers 114A, 114B, 114C, 114D, 114E, and 114F) that each functions similar to the multiplexers 64 of FIGS. 2 and 3. Although the illustrated embodiment shows only a single local bias 113 from each respective route RRS 112 to each multiplexer 114, any number (e.g., 2, 3, 4, 5, 10, 20, 126) of local biases 113 may be transmitted from each RRS 112 to a respective multiplexer 114. Furthermore, each illustrated RRS 112 provides a number (e.g., 126) of local biases 113 to two multiplexers 114. For example, RRS 112A provides a number (e.g., 126) of local biases 113A and a number (e.g., 126) of local biases 113B to multiplexer 114A. However, in some embodiments, each RRS 112 may drive a different number (e.g., 1, 3, or more) multiplexers 114. The multiplexers 114 select a selected local bias 116. The selection may be based at least in part on mode register(s) used to control the selection. For example, the multiplexer 114A selects a selected local bias 116A; the multiplexer 114B selects a selected local bias 116B; the multiplexer 114C selects a selected local bias 116C; the multiplexer 114D selects a selected local bias 116D; the multiplexer 114E selects a selected local bias 116E; and the multiplexer 114F selects a selected local bias 116F. The respective local bias 116 is transmitted from each multiplexer 114 to a respective input buffer 70 to control how the input buffer 70 and/or a related input buffer channel behaves.

Figure 5:
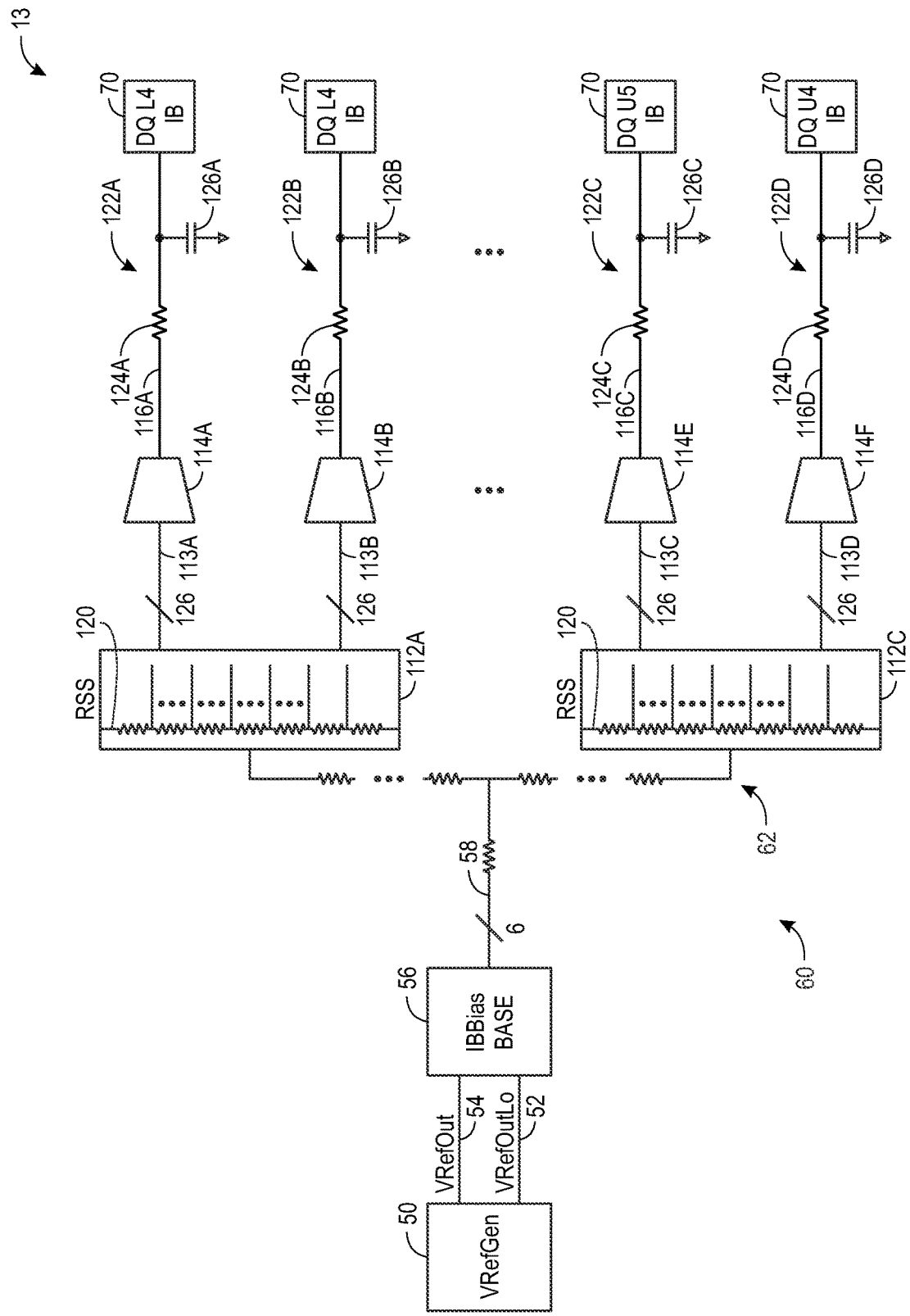
FIG. 5 is a circuit diagram of the bias generation and distribution circuitry of FIG. 4, according to an embodiment of the present disclosure.

FIG. 5 is a circuit diagram of the bias generation and distribution circuitry 13 of FIG. 4 illustrating that the RRSs 112 include a resistor stack 120 used to generate the local biases 113. As illustrated, each selected local bias 116 may be filtered using filters 122 including a resistor 124 and a capacitor 126. For example, the selected local bias 116A may be filtered using a filter 122A that includes a resistor 124A and a capacitor 126A; the selected local bias 116B may be filtered using a filter 122B that includes a resistor 124B and a capacitor 126B; the selected local bias 116C may be filtered using a filter 122C that includes a resistor 1240 and a capacitor 126C; and the selected local bias 116D may be filtered using a filter 122D that includes a resistor 124D and a capacitor 126D.

As illustrated in FIG. 5, the selected local biases 116A and 116B may be transmitted to a first region (e.g., DQ input buffers in a lower DQ input buffer region). Similarly, the selected local biases 116C and 116D may be transmitted to a second region (e.g., DQ input buffers in an upper DQ input buffer region).

Figure 6:
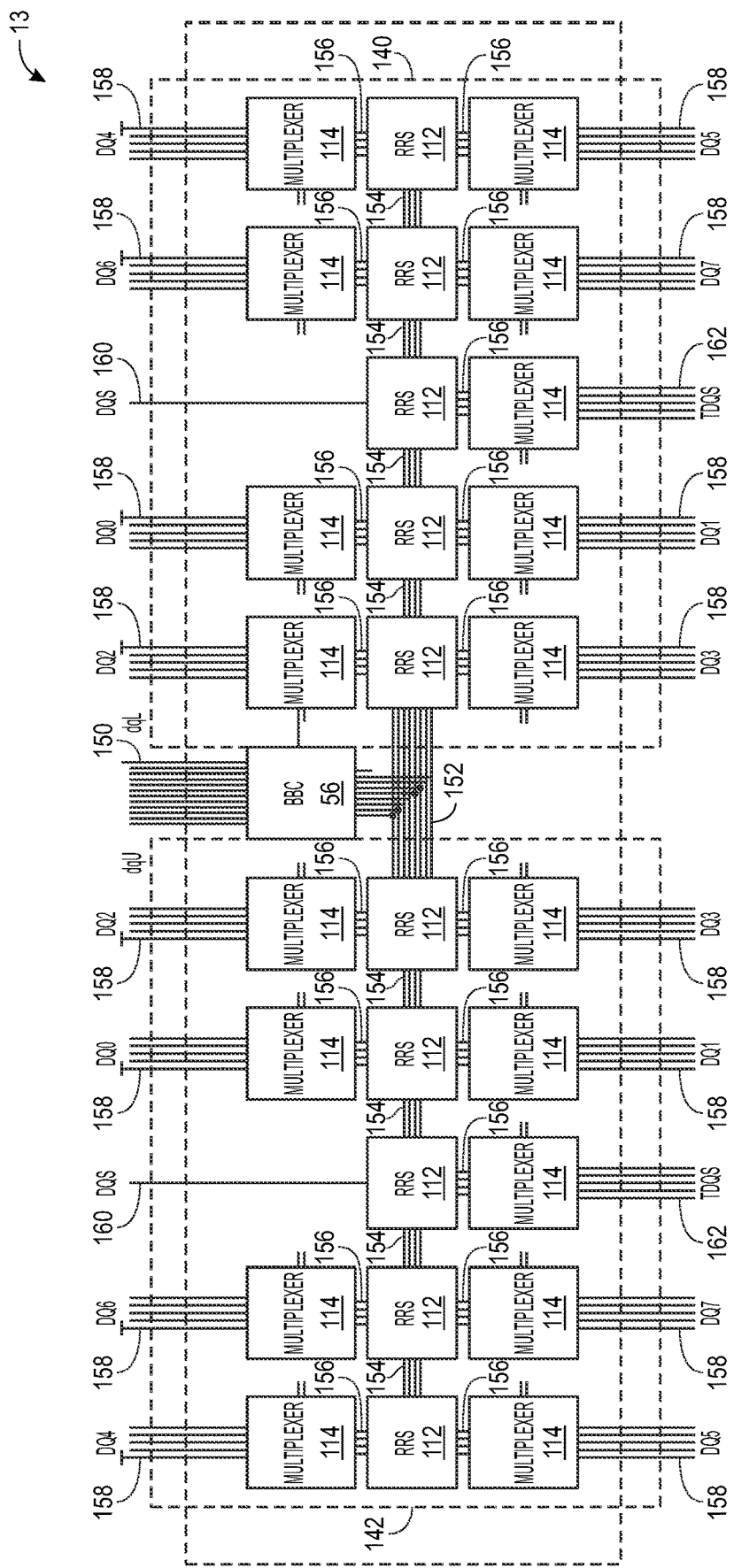
FIG. 6 is a circuit diagram showing a layout of the bias generation and distribution circuitry of FIG. 5, according to an embodiment of the present disclosure.

FIG. 6 is a layout diagram of the bias generation and distribution circuitry 13. As illustrated, the bias generation and distribution circuitry 13 includes a lower region 140 and an upper region 142. Additionally, the bias base circuitry 56 receives inputs 150. The inputs 150 may be used to transmit mode register values and/or reference voltages to the bias base circuitry 56. The bias base circuitry 56 then outputs voltages to the RRSs 112 over lines 152. Although the illustrated embodiment includes eight lines 152, the bias base circuitry 56 may output any number of voltages based on a number of resistors used in the resistor stack 62. The voltages are provided from the bias base circuitry 56 to the RRSs 112 via the lines 152 and via lines 154. The RRSs 112 then then use lines 156 to transmit the local biases 113 from the RRSs 112 to the multiplexers 114. The multiplexers 114 then output the selected local biases 116 via lines 158. Additionally, the RRSs 112 may output a data strobe (DQS) bias to bias DQS in DQS circuitry via lines 160. Furthermore, the multiplexers may output termination biasing 162 to termination data strobe (TDQS) circuitry that provides termination for DQS.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a plurality of memory banks;
   a plurality of input buffers configured to buffer data for storage in the plurality of memory banks;
   biasing generation and distribution circuitry comprising a first generator resistor stack configured to receive a plurality of reference voltages to generate a plurality of primary voltages; and
   a plurality of remote resistor stacks located at corresponding input buffers of the plurality of input buffers, wherein the respective remote resistor stacks of the plurality of input buffers transmit respective biases to be used in buffering the corresponding input buffers of the plurality of input buffers, wherein the respective biases are based at least in part on the plurality of primary voltages.

2. The memory device of claim 1 wherein each of the remote resistor stacks is configured to provide a plurality of the respective biases to a respective multiplexer of a respective input buffer of the plurality of input buffers.

3. The memory device of claim 1, wherein the respective remote resistor stacks are configured to provide the respective biases to a plurality of multiplexers each corresponding to respective input buffers of the plurality of input buffers.

4. The memory device of claim 3, wherein the respective biases comprise 126 biases.

5. The memory device of claim 3, wherein each of the plurality of multiplexers is configured to select a bias from the respective biases for a respective input buffer of the plurality of input buffers based at least in part on a mode register value.

6. The memory device of claim 5, wherein the memory device is configured to receive the mode register value from a host processor.

7. The memory device of claim 1, wherein the biasing generation and distribution circuitry comprises a plurality of second generator resistor stacks each configured to receive a pair of the plurality of primary voltages and to generate a plurality of secondary voltages.

8. The memory device of claim 7, wherein each of the plurality of remote resistor stacks is configured to receive one or more of the plurality of secondary voltages.

9. The memory device of claim 1, wherein the biasing generation and distribution circuitry comprises a plurality of amplifiers configured to amplify the plurality of reference voltages prior to transmission of the plurality of references voltages to the first generator resistor stack.

10. The memory device of claim 1, wherein the biasing generation and distribution circuitry comprises:
    a reference voltage resistor stack configured to generate available reference voltages; and
    a multiplexer configured to select the plurality of reference voltages from the available reference voltages.

11. The memory device of claim 10, wherein the multiplexer is configured to select the plurality of reference voltages based at least in part on a mode register setting received from a host processor.

12. A semiconductor device, comprising:
    a plurality of input buffers configured to buffer data for storage in the semiconductor device; and
    biasing distribution circuitry configured to distribute biases to the plurality of input buffers, wherein the biasing distribution circuitry comprises:
    a plurality of remote resistor stacks each located at a corresponding input buffer of the plurality of input buffers and each configured to receive one or more first voltages and to generate a plurality of biases from the received one or more first voltages; and
    a plurality of multiplexers each configured to receive a respective plurality of biases and to select a bias of the respective plurality of biases for a respective input buffer of the plurality of input buffers from the respective plurality of biases.

13. The semiconductor device of claim 12, wherein the biasing distribution circuitry comprises a plurality of bias filters each coupled to a respective multiplexer of the plurality of multiplexers and is configured to filter the respective selected bias before biasing a respective input buffer of the plurality of input buffers.

14. The semiconductor device of claim 12, wherein each of the plurality of remote resistor stacks is located within 100 μm of a respective input buffer.

15. The semiconductor device of claim 12, comprising generation circuitry configured to generate the one or more first voltages using a plurality of generator resistor stacks.

16. The semiconductor device of claim 15, wherein the biasing distribution circuitry comprises a plurality of routes from the plurality of generator resistor stacks to the plurality of remote resistor stacks.

17. A method, comprising:
    transmitting a plurality of voltages to a plurality of remote resistor stacks of a memory device;

generating a plurality of potential biases in biasing generation and distribution circuitry using the plurality of remote resistor stacks and based at least in part on the plurality of voltages;

transmitting the plurality of potential biases to a plurality of multiplexers;

selecting a bias for each of a plurality of input buffers from the plurality of potential biases using respective multiplexers of the plurality of multiplexers; and applying each selected bias to a respective input buffer of the plurality of input buffers to aid in performing a memory operation using the plurality of input buffers.

18. The method of claim 17, comprising filtering each selected bias prior to applying each selected bias to the respective input buffer.

19. The method of claim 17, wherein transmitting the plurality of voltages to the plurality of remote resistor stacks comprises using a distribution network to a plurality of regions of the plurality of input buffers.

* * * * *